United States Patent [19]
Curtis, Jr. et al.

[11] 3,931,574
[45] Jan. 6, 1976

[54] DEVICE AND METHOD OF WIRE WRAP (OR OTHER ELECTRICAL INTERCONNECTION BETWEEN I.C. SOCKETS) CHECKOUT

[76] Inventors: Ralph W. Curtis, Jr., 7018 Wood Thrust Drive, Lanham, Md. 20801; William P. Byrne, 9821 Raintree Road, Burke, Va. 22015; Alan G. Pezzulich, 720 N. Ripley St., Alexandria, Va. 22304

[22] Filed: Nov. 19, 1974

[21] Appl. No.: 525,251

[52] U.S. Cl............ 324/158 F; 324/51; 324/73 PC
[51] Int. Cl.²................... G01R 31/02; G01R 31/08
[58] Field of Search .... 324/158 F, 51, 73 R, 73 PC, 324/158 R

[56] References Cited
UNITED STATES PATENTS

| | | | |
|---|---|---|---|
| 2,977,530 | 3/1961 | Cook | 324/51 |
| 3,348,138 | 10/1967 | Palmentiero | 324/73 R |
| 3,439,268 | 4/1969 | Gregory et al. | 324/51 |

*Primary Examiner*—R. V. Rolinec
*Assistant Examiner*—Ernest F. Karlsen
*Attorney, Agent, or Firm*—R. S. Sciascia; Arthur L. Branning; Melvin L. Crane

[57] ABSTRACT

This invention is directed to a test module for and method of testing integrated circuit connections (i.e., wire wrap, multilayer printed circuit boards, etc.) to determine whether or not the circuits are correctly wired and whether or not there are any short circuits or broken connections, as well as any other electrical problems. The system confirms the validity of the electrical interconnections by a visual comparison of the lighted light emitting diodes and the assembly plan; if the correct comparison is not made, an error in the manufacturing process is indicated. Failure of any of the expected light emitting diodes to light indicates missing or electrically bad connections; extra lighted light emitting diodes indicate extraneous connections or short circuits on the board.

2 Claims, 3 Drawing Figures

DEVICE AND METHOD OF WIRE WRAP (OR OTHER ELECTRICAL INTERCONNECTION BETWEEN I.C. SOCKETS) CHECKOUT

BACKGROUND OF THE INVENTION

This invention relates to testing electrical circuit interconnections and more particularly to an electrical circuit tester for wire wrap boards as well as other types of electrical interconnections such as multilayer printed circuit boards, etc.

Heretofore electrical interconnections between integrated circuit socket pins have been visually checked in the case of single or double sided printed circuit boards or checked through point-to-point continuity verification as in the case of wire wrap. Further electrical test circuits have been used through use of a sequence of signal patterns applied in succession to input terminals of the boards under test. Other test systems have been set forth in Pats. Nos. 3,673,397 and 3,824,462. These test systems are complicated and require considerable parts and equipment.

SUMMARY OF THE INVENTION

A plurality of 14 or 16 dual in-line small reusable plug-in test modules each including a light emitting diode or similar device for each pin are connected to a common wire. The pin arrangement is such that they may be inserted into integrated circuit socket pins of each location of a wire wrap board. The wire wrap board is wired in accordance with an original design schematic of desired electrical circuitry which may be plugged into a panel of an electrical system. The plug-in test modules are connected together to all common points with one contact connected to one side of a power supply. A probe is connected to the other side of the power supply and touched to one pin in each circuit chain and the chain is checked in accordance with the circuitry design. The diodes in a completed circuit chain will light up to indicate no problems in that chain or short circuits to other chains.

DETAILED DESCRIPTION

Figure 1:
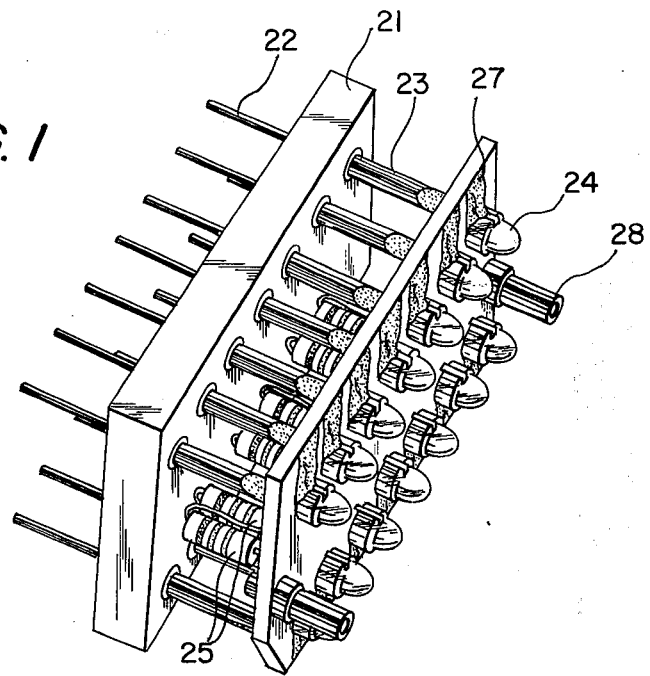
FIG. 1 illustrates an angular view which illustrates the relative parts.
Figure 2:
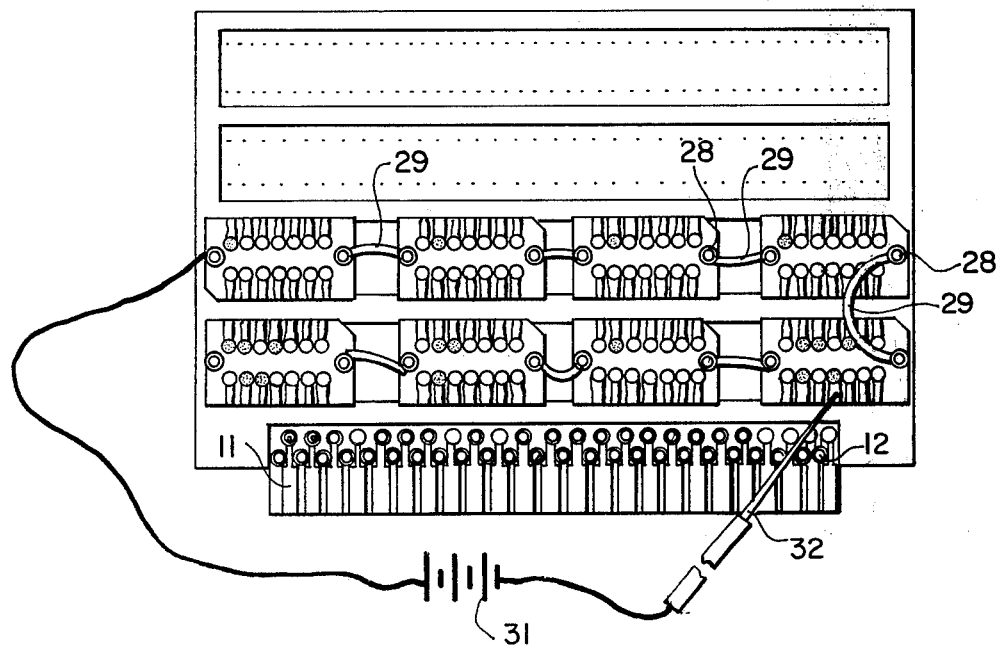
FIG. 2 illustrates a plurality of test elements in use on a wire wrap board.

The test device shown by the illustration in FIG. 1 is used to test the various electrical connections of a wire wrap board. A wire wrap board is well-known in the art. A wire wrap board is a combination printed circuit board with extended integrated circuit socket pins some of which contact the printed circuit. These may be made in different ways. Small printed circuit board construction is made with the printed circuitry formed about equally spaced rows of linearly aligned holes each of which may be provided with an electrically conductive sleeve or socket. Some sleeves are in electrical contact with the printed circuit. The integrated circuit socket pins that pass through the holes in the board are formed onto an insulating block with the socket end within the isulating block forming a sleeve or socket. These may be made as either 16 or 14 pin, dual, in-line integrated circuit sockets. These 16 or 14 pin, dual, in-line integrated circuit sockets are placed on the printed circuit board with pins extending through the printed circuit board. Electrical contact with the printed circuit and/or pins may be made by printed circuit connection terminals 11 as shown in FIG. 2. Terminals are on the bottom surface also and are in electrical contact with the contacts 12, as shown in the drawings.

Other wire wrap boards may be made in which the printed circuit boards have the pins secured to the board with the socket ends secured in the board. These pins are arranged in linearly aligned spaced pin groups of 16 or 14 (each group contain two rows of 8 or 7 pins) surrounded by the printed circuit on the board. One or more pins of each group may be electrically connected to the printed circuit. In addition to the integrated circuit socket groups of pins, two rows of pins are provided one each for each of the terminals. Thus, the wire wrap board provides a high density circuit board due to the use of wires that are connected to the pins in a particular design. The wires are insulated from each other and can cross over each other. A printed circuit board does not permit cross over of one line over the other because of a short circuit. Thus, wire wrap boards may provide greater numbers of different circuitry in a closer space than that allowed by ordinary printed circuits.

The device or plug-in test module of this invention will plug into the sockets of the integrated circuit sockets or into the sockets of the pins extending from a printed circuit board.

Electrical circuits are completed in accordance with a planned design or instructions by connecting wires from certain pins to other pins in combination with the printed circuit on the board. A completed circuit from pin to pin is known as a chain. Each wire wrap board comprises a plurality of chains which may include input or output terminals that make contact with a plug-in-type connector.

Figure 3:
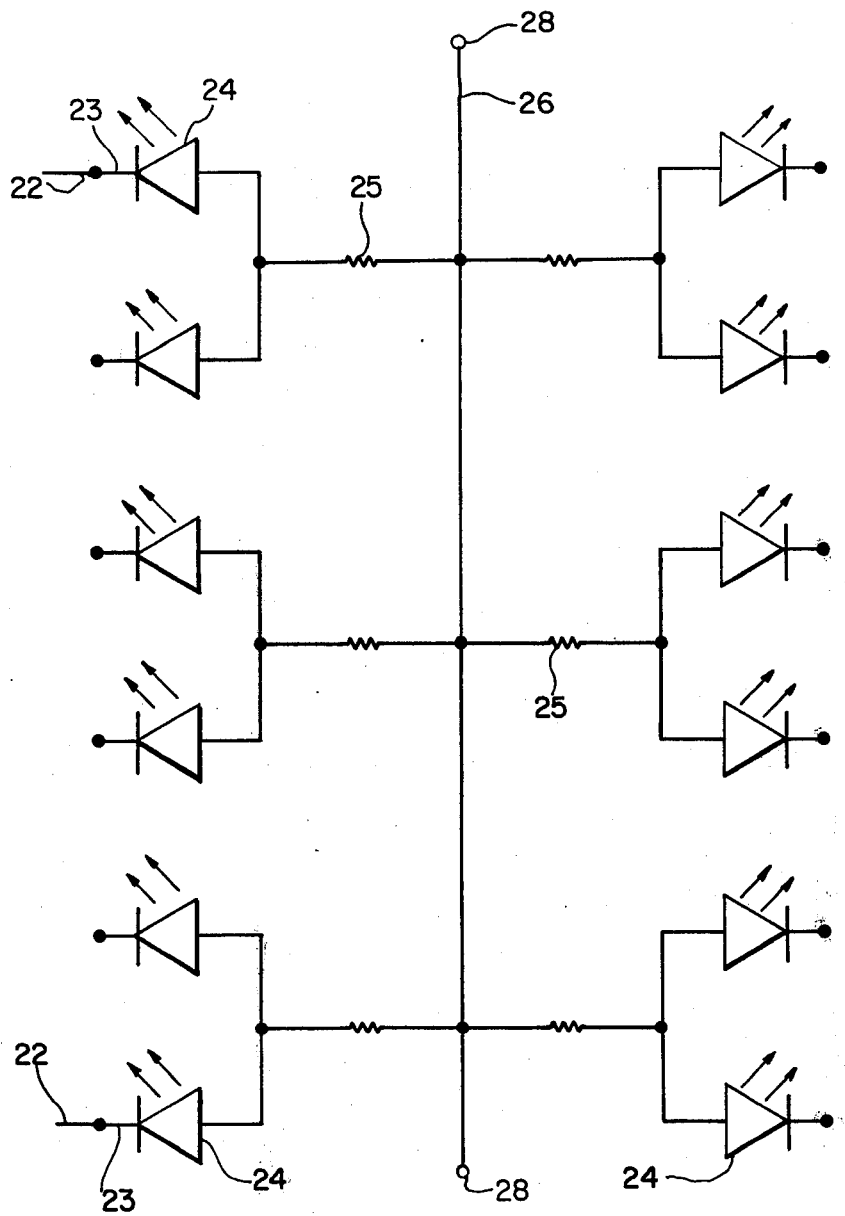
FIG. 3 is a typical schematic wiring diagram.

The test device includes an insulating material block 21 which has two rows of spaced pins 22 extending from the bottom with matching pin sockets 23 extending from the upper surface. The pins in each row are equal in number and equally spaced from each other with their spacing in each row less than the spacing between the two rows. The test device is made with either 16 or 14 pins (two rows of 8 or 7 pins) to match a like dual, in-line integrated circuit socket in the wire wrap board. Each pin extending above the insulating block is electrically connected with the cathode of a MV55 light emitting diode 24. The anodes of adjacent pairs of light emitting diodes are connected to one side of a 910 ohm, ⅛ watt, resistor 25 with the opposite side of the resistor connected to an electrical conductor 26 common to each resistor connecting each pair of diodes. The schematic diagram of the electrical circuitry is shown in FIG. 3.

As shown in FIG. 1, the resistors are assembled between the pins extending above the insulating block 21 and an upper insulating block 27 upon which the diodes are assembled. The diodes are assembled in two spaced rows corresponding to the pins 21 below the insulating block to which their cathodes are electrically connected. Each end of the common electrical conductor 26 is connected with up standing pole connectors 28 including sockets therein for easily connecting a plurality of test devices in series in an electrical circuit with a power supply for conducting the test.

In conducting a test, a plug-in test module is mated with each integrated circuit socket of a completed wire wrap card or panel irregardless to keying normally used. Each test module is connected in series with each other with a jumper wire 29 connected between poles 28 of adjacent test modules with the connector post of one end module connected to one side of a battery power supply 31. A wire having a needle point probe 32 electrically connected to one end thereof is connected at the opposite end to the other side of the power supply. The probe is then touched to one pin of one test module to complete the circuit through all of the test modules. Since every test module is connected in series to each other, the pins inserted into the integrated circuit sockets will complete different chains of electrical circuits. Thus, when the probe is touched to one pin in an electrical chain each diode in that chain will light-up to present a visual indication representative of the pins connected to each other in the electrical circuit chain. All light emitting diodes actually wired in that chain will light, giving a visual indication of which pins are actually wired. The checker will then compare the locations of the lit diodes with the wiring instructions. If all locations are not lit, the checker knows which one is not lit and the problem is found, such as a wire not connected to the pin in the socket. Also, too many diodes may be lit, this will indicate a short or that a wire has been connected to the wrong pin. If the diodes for each pin of the chain are lit in accordance with the wiring instructions and no others are lit, then the circuit chain is proper. The checker then probes another pin in a different chain and repeats the check for each pin connected chain of the wire wrap board. Through this process, the checker can check the validity of the wired wire wrap board against the assembly plan by probing the first pin in each chain. No other test is required for a properly wired wire wrap board.

In carrying out the above test, broken or deleted connections may be found. Extraneous connections due to either extra wires not called for or possible shorts caused by small wire clippings left on the board unnoticed or shorts in the printed circuit board or shorts caused by the possible cold flow of the wire insulation may be determined. Further, an indication of possible wiring instruction errors may be determined by two or more chains having a wrong common tie point.

Not only do these test modules save time in checking the entire circuitry, they indicate errors not readily found when probing each separate pin of the wire wrap board and its connected wire. A determination of short circuits or a wrong wire connection may save great damage to expensive components with which the wire wrap boards are to be used. Short circuits, broken wires, etc., may be located with the wire wrap boards from operational equipment by use of these test modules.

There may be instances where instructions for an already wired board are lost. The test modules may be used to generate an instruction list by testing as noted above and then listing the corresponding pins in the lighted chains. Thus, the wired chains of wire wrap boards may be determined and duplicated for use on other boards.

The test module has been set forth including light emitting diodes for visual inspection. Other light emitting or light reflective or light transmissive devices may be used instead of diodes. Also, the test modules have been set forth as usable with 16 or 14 pin dual in-line integrated circuit sockets. The teaching may be applied for any socket configuration such as the mini-dip and TO-5 type socket, the 24 pin DIP sockets, etc. The important thing is that the test module mate with the integrated circuit socket.

FIG. 3 represents one wiring circuit design. A resistor 25 may be connected to each diode rather than two diodes to one resistor. Also, more than two diodes could be connected to one resistor shown. Further the diodes may be reversed from that shown.

Obviously many modifications and variations of the present invention are possible in light of the above teachings. It is therefore to be understood that within the scope of the appended claims the invention may be practiced otherwise than as specifically described.

What is claimed and desired to be secured by letters patent of the United States is:

1. A reuseable plug-in test module for testing wire wrap board electrically interconnected circuits which comprises:
    a base made of electrically insulating material;
    a pair of rows of linearly aligned equally spaced socket pins secured in said base and insulated from each other;
    said pins extending above and below said base,
    a plurality of visual light emitting means electrically connected with one each of said spaced socket pins above said base;
    an electrical conductor common to each of said light emitting means;
    a resistor means electrically connected between each said light emitting means and said common electrical conductor;
    an electrical conductor post connected with each end of said common electrical conductor;
    a thin insulator board secured above the upper ends of said socket pins in said base and supported thereby,
    said insulator board supporting said plurality of visual light emitting means, said resistor means, said common electrical conductor, and said electrical posts connected with each end of said common electrical conductor.

2. A reusable plug-in test module as claimed in claim 1; wherein each said light emitting means is a diode.

* * * * *